(12) United States Patent
Inazuki et al.

(10) Patent No.: US 6,641,958 B2
(45) Date of Patent: Nov. 4, 2003

(54) PHASE SHIFT MASK BLANK, PHASE SHIFT MASK, AND METHODS OF MANUFACTURE

(75) Inventors: Yukio Inazuki, Kubiki-mura (JP); Tamotsu Maruyama, Kubiki-mura (JP); Mikio Kojima, Kubiki-mura (JP); Hideo Kaneko, Kubiki-mura (JP); Masataka Watanabe, Kubiki-mura (JP); Satoshi Okazaki, Kubiki-mura (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 195 days.

(21) Appl. No.: 09/902,645

(22) Filed: Jul. 12, 2001

(65) Prior Publication Data

US 2002/0025478 A1 Feb. 28, 2002

(30) Foreign Application Priority Data

Jul. 13, 2000 (JP) ........................................ 2000-212782

(51) Int. Cl.$^7$ ................................................ G03F 9/00
(52) U.S. Cl. .......................................................... 430/5
(58) Field of Search ............................ 430/5, 322, 323; 216/58, 62

(56) References Cited

U.S. PATENT DOCUMENTS

| | | |
|---|---|---|
| 5,605,776 A | 2/1997 | Isao et al. |
| 5,635,315 A | 6/1997 | Mitsui |
| 5,942,356 A * | 8/1999 | Mitsui et al. ............... 430/5 |
| 6,309,780 B1 * | 10/2001 | Smith ........................... 430/5 |

FOREIGN PATENT DOCUMENTS

| | | |
|---|---|---|
| EP | 1117000 A2 | 1/2001 |
| JP | 7-140635 | 6/1995 |

OTHER PUBLICATIONS

International Search Report, Jun. 10, 2002.

Abstract of Japanese 7–140635.

* cited by examiner

*Primary Examiner*—S. Rosasco
(74) *Attorney, Agent, or Firm*—Millen, White, Zelano, Branigan, P.C.

(57) ABSTRACT

A phase shift mask blank includes a transparent substrate and a phase shift film composed primarily of a metal and silicon. The substrate has an etch rate A and the phase shift film has an etch rate B when the blank is patterned by reactive ion etching, such that the etch selectivity B/A is at least 5.0. When a phase shift mask is manufactured from the blank, the substrate is less prone to overetching, providing good controllability and in-plane uniformity of the phase shift in patterned areas. The phase shift mask can be used to fabricate semiconductor integrated circuits to a smaller minimum feature size and a higher level of integration.

16 Claims, 4 Drawing Sheets

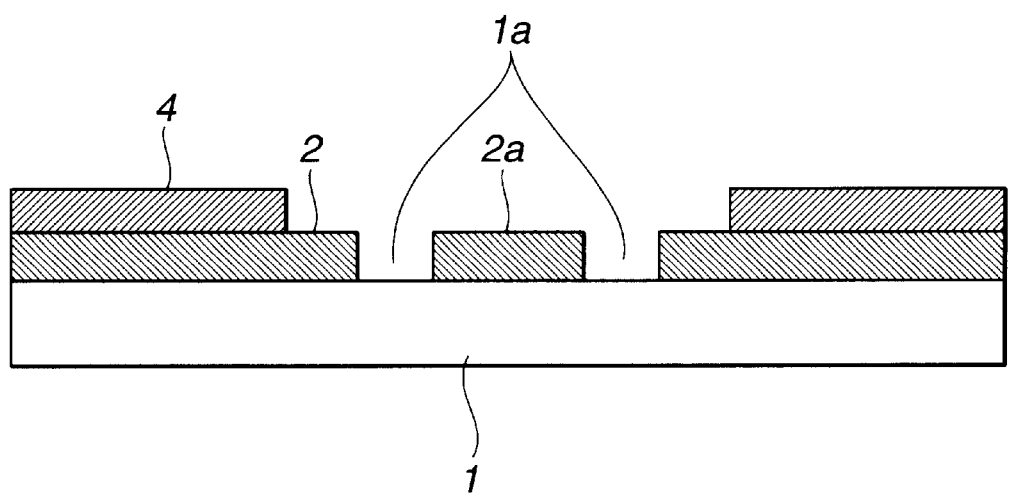
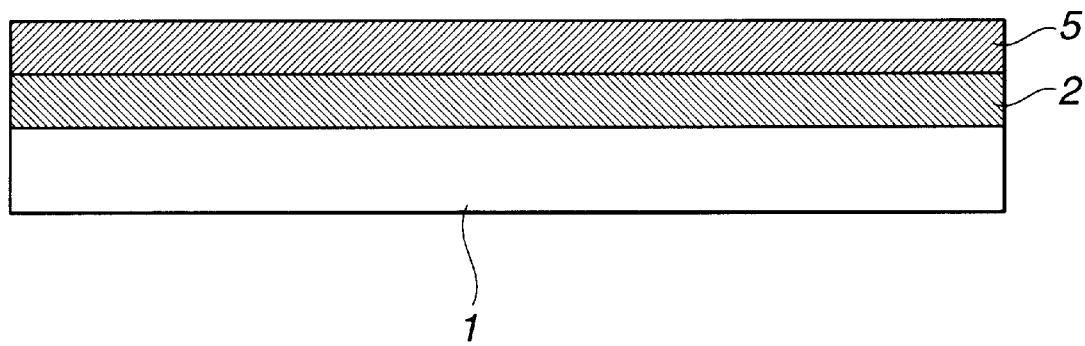

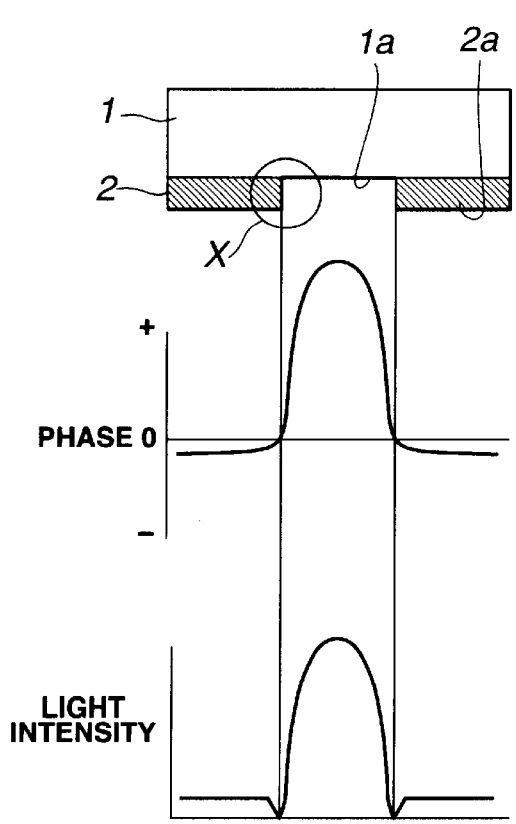
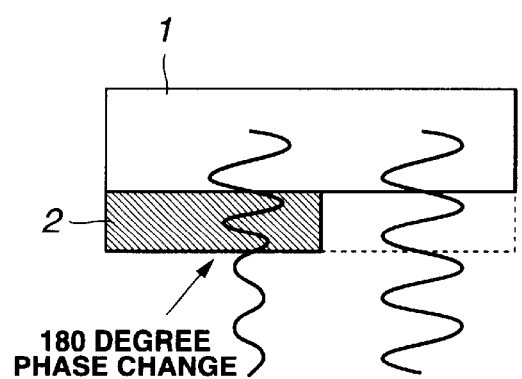
FIG.6(A)
FIG.6(B)
180 DEGREE PHASE CHANGE
PHASE 0
LIGHT INTENSITY

US 6,641,958 B2

PHASE SHIFT MASK BLANK, PHASE SHIFT MASK, AND METHODS OF MANUFACTURE

BACKGROUND OF THE INVENTION

1. Field of the Invention

The present invention relates to phase shift mask blanks and phase shift masks for use in the microfabrication of high-density semiconductor integrated circuits such as large-scale integration (LSI) and very large-scale integration (VLSI) chips, charge-coupled devices, color filters for liquid-crystal displays, and magnetic heads. The invention relates also to methods of manufacturing such phase shift mask blanks and phase shift masks. More particularly, the invention relates to halftone phase shift mask blanks and phase shift masks which can attenuate the intensity of exposure wavelength light with a phase shift film, and to methods of manufacturing such phase shift mask blanks and phase shift masks.

2. Prior Art

The photomasks that are used in a broad range of applications, including the manufacture of semiconductor integrated circuits (IC) and LSI chips, are basically composed of a transparent substrate on which a light-shielding layer made primarily of chromium has been formed in a given pattern. The market demand for ever higher levels of integration in semiconductor integrated circuits has led to a rapid reduction in the minimum feature size of photomask patterns. Such miniaturization has been achieved in part by the use of exposure light of shorter wavelengths.

However, while exposure using shorter wavelength light does improve resolution, it also has a number of undesirable effects, such as reducing the focal depth, lowering process stability and adversely impacting product yield.

One pattern transfer technique that has been effective for resolving such problems is phase shifting. This involves the use of a phase shift mask as the mask for transferring patterns having a small minimum feature size.

As shown in FIG. 6, a phase shift mask (halftone phase shift mask) typically has a phase shifter 2a that forms a patterned area on the mask and an area 1a without phase shifter where the substrate lies exposed to incident light. The phase shift mask improves contrast of the transferred image by providing a phase difference of 180 degrees between light passing through the patterned and unpatterned areas, and utilizing the destructive interference of light at the boundary regions of the pattern to set the light intensity in the interference regions to zero. The use of phase shifting also makes it possible to increase the focal depth at the necessary resolution. Hence, compared with a conventional mask having an ordinary exposure pattern, such as one composed of chromium film, the use of a phase shift mask can improve resolution and increase the margin of the exposure process.

For practical purposes, such phase shift masks can be broadly categorized, according to the light-transmitting characteristics of the phase shifter, as either completely transmitting phase shift masks or halftone phase shift masks. Completely transmitting phase shift masks are masks in which the phase shifter has the same light transmittance as the substrate, and which are thus transparent to light at the exposure wavelength. In halftone phase shift masks, the phase shifter has a light transmittance that ranges from about several percent to several tens of percent the transmittance of exposed substrate areas (unpatterned areas).

FIG. 1 shows the basic structure of a halftone phase shift mask blank, and FIG. 2 shows the basic structure of a halftone phase shift mask. The halftone phase shift mask blank shown in FIG. 1 is composed of a substrate 1 which is transparent to the exposure light, and on which a halftone phase shift film 2 has been formed. The halftone phase shift mask shown in FIG. 2 is composed of a halftone phase shifter 2a which forms the patterned areas of the mask, and exposed substrate areas 1a on which there is no phase shift film.

Exposure light that has passed through the phase shifter 2a is phase-shifted relative to exposure light that has passed through exposed substrate areas 1a. The transmittance of the phase shifter 2a is selected such that exposure light which has passed through the phase shifter 2a has too low an intensity to sensitize the resist on the substrate to which the pattern is being transferred. Accordingly, the phase shifter functions to substantially shield out exposure light.

The above-described halftone phase shift mask include halftone phase shift masks having a simple, single-layer structure. Single-layer halftone phase shift masks known to the art include those described in JP-A 7-140635 which have a phase shifter composed of molybdenum silicide oxide (MoSiO) or molybdenum silicide oxide nitride (MoSiON).

A lithographic process may be used to manufacture such phase shift masks. The lithographic process typically involves applying a resist onto the phase shift mask blank, sensitizing desired areas of the resist with electron beams or ultraviolet light, carrying out development to expose the surface of the phase shift film, then etching the desired areas of the phase shift film using the patterned resist film as the mask so as to expose the substrate. The resist film is then stripped, giving the finished phase shift mask. The etching process employed for this purpose is generally reactive ion etching with a fluorine-containing gas. The material ordinarily used as the transparent substrate is quartz.

Because reactive ion etching using a fluorine-containing gas also etches quartz, overetching during the phase shift film etching step has the undesirable effect of removing some of the quartz in the exposed substrate areas. As a result, the substrate in the exposed substrate areas becomes thinner than the substrate in the phase shifter areas, creating a difference in the light path within the substrate between the phase shifter areas and the exposed substrate areas. This difference in turn causes the amount of phase shift to become larger than that set by the phase shift film and thus to deviate from the intended value.

Also, reactive ion etching normally entails a certain degree of variation within the plane of the substrate. Hence, by the time etching is complete in those areas where the substrate is to be exposed, the amount of phase shift ends up differing between those areas within the substrate plane where the substrate surface becomes exposed a little earlier and those areas where it becomes exposed a little later. As a result, the distribution in phase shift within the plane of the phase shift mask substrate worsens, making it difficult to stably manufacture high-quality phase shift masks having a high in-plane uniformity in the phase shift. An improvement in this regard has been strongly desired in the industry.

SUMMARY OF THE INVENTION

It is therefore an object of the present invention to provide high-quality phase shift mask blanks and phase shift masks manufactured therefrom which have a phase shift layer with a larger etch selectivity versus the substrate so that the substrate is not excessively etched when the phase shift mask is manufactured from the phase shift mask blank, in which the phase shift in the patterned areas has a good controllability, and which have a high in-plane uniformity in the phase shift distribution. Another object of the invention is to provide methods of manufacturing such phase shift mask blanks and phase shift masks.

It has been found that, in a phase shift mask blank having a transparent substrate and at least one phase shift film layer composed primarily of a metal and silicon on the substrate, the use of a phase shift film having a larger etch selectivity with respect to the substrate, and in particular a phase shift film made of molybdenum silicide oxide carbide (MoSiOC) or molybdenum silicide oxide nitride carbide (MoSiONC), makes it possible to prevent excessive etching of the substrate when a phase shift mask is patterned from a phase shift mask blank. As a result, the phase shift in the patterned areas has good controllability, enabling a phase shift mask having a high in-plane uniformity in the phase shift distribution to be achieved.

Accordingly, in a first aspect, the invention provides a phase shift mask blank having a transparent substrate and at least one phase shift film layer composed primarily of a metal and silicon on the substrate, wherein the substrate has an etch rate A and the phase shift film has an etch rate B when the blank is patterned by reactive ion etching such that the etch selectivity B/A is at least 5.0.

The phase shift film is preferably made of molybdenum silicide oxide carbide or molybdenum silicide oxide nitride carbide. Typically, it changes the phase of exposure light passing through it by 180±5 degrees and has a transmittance of 3 to 40%.

In a second aspect, the invention provides a phase shift mask manufactured by lithographically patterning the phase shift mask blank of the first aspect of the invention.

In a third aspect, the invention provides a method of manufacturing a phase shift mask blank having a transparent substrate and at least one phase shift film layer composed primarily of a metal and silicon on the substrate, in which method reactive sputtering is carried out using a molybdenum and silicon-containing target and a carbon-containing gas.

In the above phase shift mask blank manufacturing method, it is preferable for the substrate to have an etch rate A and the phase shift film to have an etch rate B when the blank is patterned by reactive ion etching such that the etch selectivity B/A is at least 5.0. Reactive sputtering is typically carried out using carbon dioxide as the carbon-containing gas. Moreover, the phase shift film preferably changes the phase of exposure light passing through it by 180±5 degrees and has a transmittance of 3 to 40%.

In a fourth aspect, the invention provides a method of manufacturing a phase shift mask by lithographically patterning the phase shift mask blank made by the method according to the third aspect of the invention.

The invention increases the phase shift film etch rate in a halftone phase shift mask blank so as to make the difference between this rate and the substrate etch rate larger. As a result, deviations from the desired phase shift due to overetching of the substrate can be reduced, making it possible to manufacture, with good control and stability, high-quality phase shift masks having a uniform phase shift distribution within the plane of the substrate. Such phase shift masks can be used to fabricate semiconductor integrated circuits to a smaller minimum feature size and higher level of integration.

BRIEF DESCRIPTION OF THE DRAWINGS

The objects, features and advantages of the invention will become more apparent from the following detailed description, taken in conjunction with the accompanying drawings.

FIG. 3 is a sectional view of a phase shift mask according to another embodiment of the invention.

FIG. 4 is a sectional view of the phase shift mask blank from which the phase shift mask in FIG. 3 is made.

FIG. 5 are schematic sectional views illustrating the method of manufacturing phase shift masks according to the invention.

FIGS. 6A and 6B illustrate the operating principle of a halftone phase shift mask. FIG. 6B is an enlarged view of region X in FIG. 6A.

DETAILED DESCRIPTION OF THE INVENTION

Figure 1:
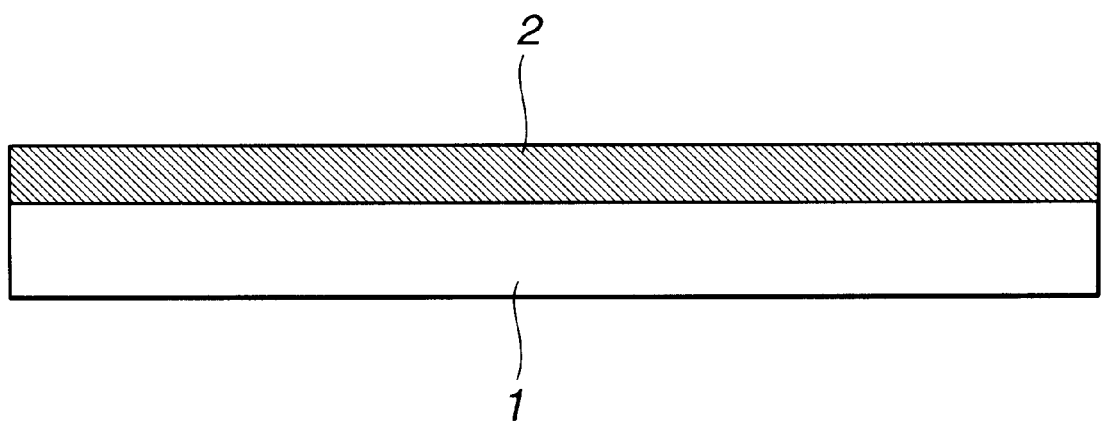
FIG. 1 is a sectional view of a phase shift mask blank according to one embodiment of the invention.

Referring to FIG. 1, the phase shift mask blank of the invention is made up of a substrate 1 which is transparent to the exposure light and a phase shift film 2 composed primarily of a metal and silicon that has been formed on the substrate 1. The substrate has an etch rate A and the phase shift film has an etch rate B when the phase shift mask blank is patterned by reactive ion etching such that the etch selectivity B/A is at least 5.0. As a result, excessive etching of the substrate can be prevented and controllability of the phase shift in patterned areas is good, giving a phase shift mask having a high in-plane uniformity.

An etch selectivity of at least 5.0 can be achieved by regulating the composition of the phase shift film. This involves adjusting the relative proportion of components which slow the etch rate in the phase shift layer and components which speed up the etch rate.

As noted above, the phase shift film is composed primarily of a metal and silicon. The film is preferably made of molybdenum silicide oxide carbide (MoSiOC) or molybdenum silicide oxide nitride carbide (MoSiONC). To achieve an etch selectivity of at least 5.0, a molybdenum silicide oxide carbide (MoSiOC) film having a composition of 5 to 25 atom % molybdenum, 10 to 35 atom % silicon, 30 to 70 atom % oxygen and 3 to 20 atom % carbon, or a molybdenum silicide oxide nitride carbide (MoSiONC) film having a composition of 5 to 25 atom % molybdenum, 10 to 35 atom % silicon, 30 to 60 atom % oxygen, 5 to 30 atom % nitrogen and 3 to 20 atom % carbon, is preferred.

It is advantageous for the phase shift film to change the phase of exposure light passing through it by 180±5 degrees and to have a transmittance of 3 to 40%. Preferably, the transparent substrate used together with the phase shift film is composed primarily of quartz or silicon dioxide.

In the practice of the invention, the phase shift film is not necessarily limited to a single layer. For example, as shown in FIG. 3, the phase shift mask of the invention may include a light-shielding film 4 that has been formed over the phase shift film 2. The use of a chromium-based film such as CrO, CrN, CrON, or CrCON as the light-shielding film is preferred.

The only region where the etch selectivity with respect to the substrate needs to be large is near the boundary between the substrate and the phase shift film. Hence, as shown in FIG. 4, it is also possible to form on the substrate side a first phase shift film 2 having an etch selectivity of at least 5.0 and to form on the first phase shift layer 2 a second phase shift film 5 having an etch selectivity with respect to the substrate 1 of less than 5.0, so as to give a phase shift film having a multilayer structure in which the etch rate increases in a continuous or stepwise manner from the surface side to the transparent substrate side. By the same token, a film structure can be adopted in which the etch rate of the phase shift film is varied in a continuous or stepwise manner so that the etch selectivity on the substrate side becomes at least 5.0.

The phase shift film in the invention is preferably formed by reactive sputtering in which the sputtering target is composed primarily of a metal and silicon. The target may be composed entirely of a metal and silicon, although a target in which one or more elements selected from among oxygen, nitrogen and carbon has been added to the metal may be used to keep the film composition constant within the plane of the film. Molybdenum is preferred as the metal.

The sputtering process may be one which employs a direct-current power supply (DC sputtering) or a high-frequency power supply (RF sputtering). Either a magnetron sputtering system or a conventional sputtering system may be used. The film-forming system may be either a continuous, in-line system or a single-workpiece processing system.

To obtain a phase shift film having the desired composition, the sputtering gas used during formation of the phase shift film may be composed of an inert gas such as argon to which have been suitably added oxygen, nitrogen, a nitrogen oxide gas, and a carbon-containing gas such as a carbon oxide gas. Exemplary carbon-containing gases include hydrocarbon gases such as methane, and the carbon oxide gases carbon monoxide and carbon dioxide. The use of carbon dioxide is especially preferred because, in addition to serving as both a carbon source and an oxygen source, it is a stable gas having a low reactivity.

The sputtering gas used to form a MoSiOC or MoSiONC film is composed of an inert gas such as argon and a carbon-containing mixed gas as the carbon source. Other gases such as oxygen, nitrogen and nitrogen oxide gases may be suitably added so as to give the phase shift film that is formed the desired composition.

More specifically, formation of a MoSiOC film is preferably carried out by reactive sputtering using molybdenum silicide as the sputtering target and a combination of argon and carbon dioxide as the sputtering gas. Formation of a MoSiONC film is preferably carried out by reactive sputtering using molybdenum silicide as the target and a combination of argon, carbon dioxide and nitrogen as the sputtering gas.

The transmittance of the phase shift film which forms may be raised by increasing the amount of oxygen and nitrogen-containing gases added to the sputtering gas or by using as the sputtering target a metal silicide to which a large amount of oxygen and nitrogen have been added, so that more oxygen and nitrogen are incorporated into the film.

Figure 2:
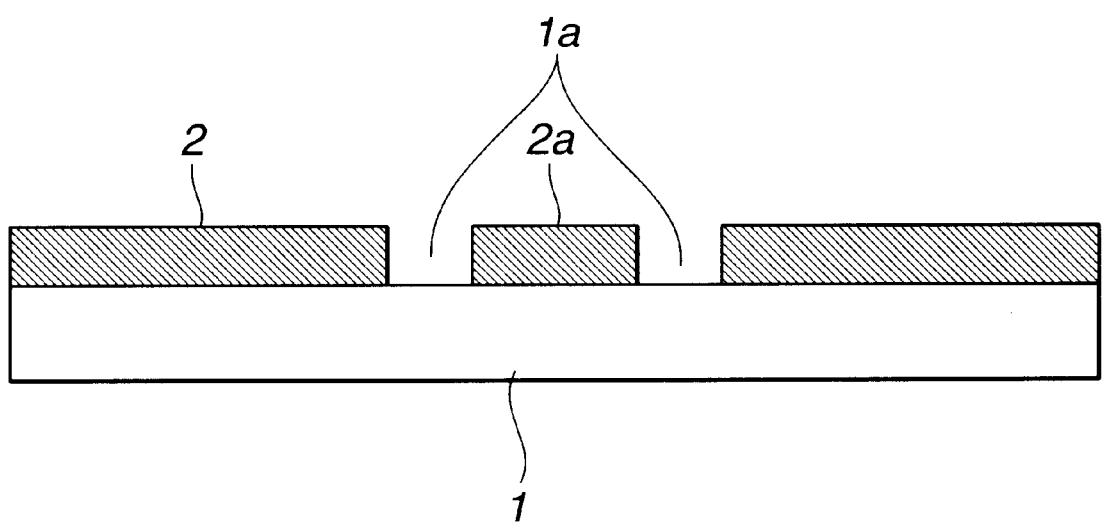
FIG. 2 is a sectional view of a phase shift mask made from the same blank.
Figure 5A:
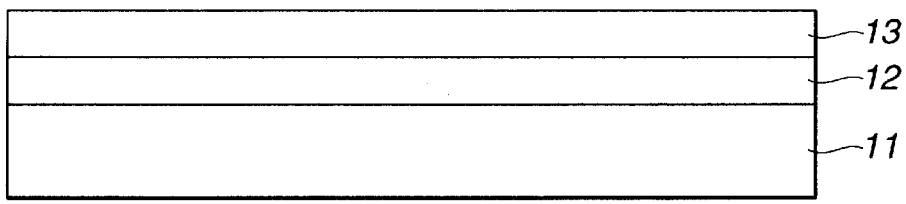
FIG. 5A shows the mask blank on which a resist film has been formed.
Figure 5B:
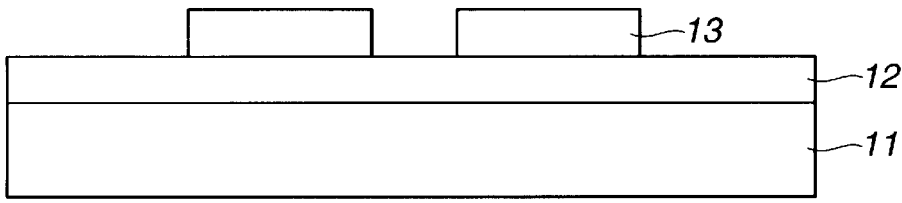
FIG. 5B shows the mask workpiece after the resist film has been patterned.
Figure 5C:
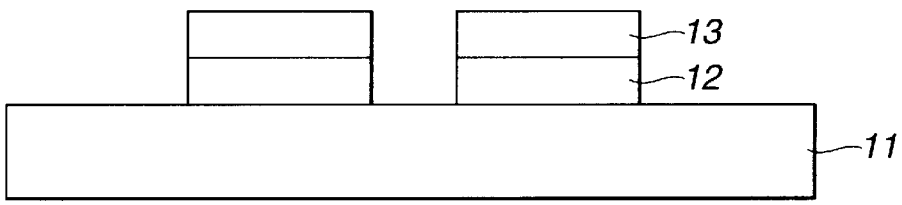
FIG. 5C shows the workpiece after etching has been carried out.
Figure 5D:
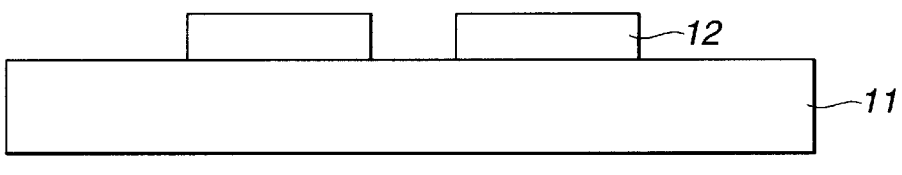
FIG. 5D shows the completed mask after the resist film has been removed.

A phase shift mask as shown in FIG. 2 is manufactured from the inventive phase shift mask blank by first forming a phase shift film 12 on a transparent substrate 11 and then forming a resist film 13 on the phase shift film 12 (FIG. 5A). Next, the resist film 13 is patterned (FIG. 5B), after which the phase shift film 12 is etched (FIG. 5C). The resist film 13 is subsequently stripped (FIG. 5D). In this process, application of the resist film, patterning (exposure and development), and resist film removal may be carried out by known techniques.

Etching is preferably carried out by a dry etching process, and most preferably reactive ion etching (RIE). Reactive ion etching may be performed using a reactive ion etching system. The etching gas is preferably a fluorine-containing gas such as $CF_4$, either used by itself or in combination with argon, helium or oxygen.

The resulting phase shift mask of the invention has minimal deviation from the desired phase shift due to overetching of the substrate, and thus has a uniform phase shift distribution within the plane of the substrate, making it well-suited to the fabrication of semiconductor integrated circuits to a smaller minimum feature size and a higher level of integration.

EXAMPLES

The following examples and comparative examples are provided by way of illustration, and are not intended to limit the scope of the invention.

Example 1

A MoSiONC film was formed on a quartz substrate to a thickness of 140 nm by carrying out reactive sputtering in a sputtering system using molybdenum silicide as the target and using a mixture of argon, carbon dioxide and nitrogen in a flow rate ratio of 5:3:3 as the sputtering gas.

The optical properties for 248 nm light, specifically the phase shift difference and transmittance, of the resulting sample were measured. The phase shift film was found to provide a phase shift of 182 degrees and a transmittance of 8.3%. The composition of the phase shift film, as determined by x-ray photoelectron spectroscopy (XPS), was 14 atom % molybdenum, 23 atom % silicon, 46 atom % oxygen, 10 atom % nitrogen, and 8 atom % carbon.

Etching of the resulting phase shift mask blank in a reactive ion etching system at 50 W, 20 Pa, a $CF_4$ flow rate of 50 sccm and an $O_2$ flow rate of 3 sccm resulted in a phase shift film etch rate of 35.0 nm/min. The quartz substrate etch rate under the same conditions was 6.2 nm/min. Hence, the etch selectivity was 5.6. The results are shown in Table 1.

Comparative Example 1

Aside from using oxygen gas instead of carbon dioxide, a MoSiON film was formed to a thickness of 130 nm in the same way as in Example 1, giving a phase shift film which provided a phase shift for 248 nm light of 182 degrees and a transmittance of 7.0%. The composition of the phase shift film, as determined by XPS, was 13 atom % molybdenum, 26 atom % silicon, 47 atom % oxygen, and 14 atom % nitrogen. The level of carbon was below the limit of detection.

The resulting phase shift mask blank was reactive ion etched under the same conditions as in Example 1, resulting in a phase shift film etch rate of 28.7 nm/min. The quartz substrate etch rate under the same conditions was 6.2 nm/min. Hence, the etch selectivity was 4.6. The results are shown in Table 1.

TABLE 1

| | Etched material | Etch rate (nm/min) | Etch selectivity versus substrate |
|---|---|---|---|
| | quartz substrate | 6.2 | — |
| Example 1 | MoSiONC | 35.0 | 5.6 |
| Comparative Example 1 | MoSiON | 28.7 | 4.6 |

From the results in Table 1, it is apparent that the MoSiONC film in Example 1 had a higher etch rate than the MoSiON film in Comparative Example 1. Hence, in Example 1, overetching of the substrate in the reaction ion etching step during phase shift mask production results in little deviation from the selected phase shift value, making it possible to improve the in-plane uniformity of the phase shift.

Therefore, the present invention, by using a phase shift film which has a larger etch selectivity with respect to the substrate and is preferably made of MoSiOC or MoSiONC, provides high-quality phase shift mask blanks and phase shift masks which have little deviation from the selected phase shift values due to overetching in the reactive ion etching step of mask fabrication, and thus have an improved in-plane uniformity in the phase shift.

Japanese Patent Application No. 2000-212782 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A phase shift mask blank comprising a transparent substrate and at least one phase shift film layer made of molybdenum silicide oxide carbide or molybdenum silicide oxide nitride carbide on the substrate, wherein the substrate has an etch rate A and the phase shift film has an etch rate B when the blank is patterned by reactive ion etching such that the etch selectivity B/A is at least 5.0.

2. The phase shift mask blank of claim 1, wherein the phase shift film changes the phase of exposure light passing through it by 180±5 degrees and has a transmittance of 3 to 40%.

3. A phase shift mask manufactured by lithographically patterning the phase shift mask blank of claim 1.

4. A phase shift mask blank according to claim 1, further comprising a light-shielding film formed over said at least one phase shift film.

5. A phase shift mask blank according to claim 4, wherein said light-shielding film is made of CrO, CrN, CrON, or CrCON.

6. A phase shift mask blank according to claim 1, wherein said mask has a first phase shift film having an etch selectivity of at least 5.0 and, formed on said first phase shift layer, a second phase shift film having an etch selectivity with respect to the substrate of less than 5.0.

7. A phase shift mask blank according to claim 1, wherein said mask has a first phase shift film having an etch selectivity of at least 5.0 and, formed on said first phase shift layer, a second phase shift film having an etch selectivity with respect to the substrate of less than 5.0.

8. A method of manufacturing a phase shift mask blank having a transparent substrate and at least one phase shift film layer made of molybdenum silicide oxide carbide or molybdenum silicide oxide nitride carbide on the substrate, the method comprising the step of carrying out reactive sputtering using a molybdenum and silicon-containing target and using a carbon-containing sputtering gas, wherein the substrate has an etch rate A and the phase shift film has an etch rate B when the blank is patterned by reactive ion etch rate B when the blank is patterned by reactive ion etching such that the etch selectively B/A is at least 5.0.

9. The phase shift mask blank manufacturing method of claim 6, wherein the substrate has an etch rate A and the phase shift film has an etch rate B when the blank is patterned by reactive ion etching such that the etch selectivity B/A is at least 5.0.

10. The phase shift mask blank manufacturing method of claim 6, wherein reactive sputtering is carried out using carbon dioxide as the carbon-containing gas.

11. The phase shift mask blank manufacturing method of claim 6, wherein the phase shift film changes the phase of exposure light passing through it by 180±5 degrees and has a transmittance of 3 to 40%.

12. A method of manufacturing a phase shift mask by lithographically patterning the phase shift mask blank made by the method of claim 6.

13. A phase shift mask blank comprising a transparent substrate and at least one phase shift film layer made of molybdenum silicide oxide carbide (MoSiOC) having a composition of 5–25 atom % molybdenum, 10–35 atom % silicon, 30–70 atom % oxygen, and 3–20 atom % carbon, or molybdenum silicide oxide nitride carbide (MoSiONC) having a composition of 5–25 atom % molybdenum, 10–35 atom % silicon, 30–60 atom % oxygen, 5–30 atom % nitrogen, and 3–20 atom % carbon on the substrate, wherein the substrate has an etch rate A and the phase shift film has an etch rate B when the blank is patterned by reactive ion etching such that the etch selectivity B/A is at least 5.0.

14. A phase shift mask blank according to claim 13, further comprising a light-shielding film formed over said at least one phase shift film.

15. A phase shift mask blank according to claim 14, wherein said light-shielding film is made of CrO, CrN, CrON, or CrCON.

16. A method of manufacturing a phase shift mask blank having a transparent substrate and at least one phase shift film layer made of molybdenum silicide oxide carbide (MoSiOC) having a composition of 5–25 atom % molybdenum, 10–35 atom % silicon, 30–70 atom % oxygen, and 3–20 atom % carbon, or molybdenum silicide oxide nitride carbide (MoSiONC) having a composition of 5–25 atom % molybdenum, 10–35 atom % silicon, 30–60 atom % oxygen, 5–30 atom % nitrogen, and 3–20 atom % carbon on the substrate, the method comprising the step of carrying out reactive sputtering using a molybdenum and silicon-containing target and using a carbon-containing sputtering gas, wherein the substrate has an etch rate A and the phase shift film has an etch rate B when the blank is patterned by reactive ion etch rate B when the blank is patterned by reactive ion etching such that the etch selectively B/A is at least 5.0.

* * * * *